United States Patent [19]
Belcher et al.

[11] Patent Number: 5,589,844
[45] Date of Patent: Dec. 31, 1996

[54] AUTOMATIC ANTENNA TUNER FOR LOW-COST MOBILE RADIO

[75] Inventors: Donald K. Belcher, Rogersville, Tenn.; David C. Bailey, Cocoa Beach, Fla.

[73] Assignee: Flash Comm, Inc., Melbourne, Fla.

[21] Appl. No.: 470,542

[22] Filed: Jun. 6, 1995

[51] Int. Cl.⁶ .................................................. H01Q 1/50
[52] U.S. Cl. .......................... 343/860; 343/850; 343/861; 333/32; 333/17.3; 455/123
[58] Field of Search ........................... 343/850, 852, 343/858, 860, 861; 333/32, 17.3; 455/123, 125, 115; H01Q 1/50

[56] References Cited

U.S. PATENT DOCUMENTS

| | | | |
|---|---|---|---|
| Re. 25,834 | 8/1965 | Gelzer et al. | 336/20 |
| 3,179,907 | 4/1965 | Brand et al. | 334/1 |
| 3,183,464 | 5/1965 | Takahata et al. | 336/142 |
| 3,475,703 | 10/1969 | Kennedy et al. | 333/17.3 |
| 3,477,299 | 11/1969 | Speer et al. | 74/10.41 |
| 3,510,808 | 5/1970 | Baker | 334/49 |
| 3,688,048 | 8/1972 | Clark | 370/18 |
| 3,723,882 | 3/1973 | Carlson | 325/357 |
| 3,914,715 | 10/1975 | Hubing et al. | 333/24 R |
| 3,956,701 | 5/1976 | James, Jr. et al. | 343/881 |
| 4,025,882 | 5/1977 | Takeo | 334/45 |
| 4,050,050 | 9/1977 | Nakanishi et al. | 338/190 |
| 4,052,675 | 10/1977 | Valdettaro | 325/465 |
| 4,063,229 | 12/1977 | Welsh et al. | 340/280 |
| 4,083,003 | 4/1978 | Haemmig | 325/6 |
| 4,107,689 | 8/1978 | Jellinek | 340/991 |
| 4,123,754 | 10/1978 | Armstrong | 342/44 |
| 4,129,749 | 12/1978 | Goldman | 370/30 |
| 4,185,287 | 1/1980 | Hubing et al. | 343/761 |
| 4,207,522 | 6/1980 | Thornton et al. | 455/77 |
| 4,234,960 | 11/1980 | Spilsbury et al. | 455/151 |
| 4,263,674 | 4/1981 | Morii et al. | 455/175 |
| 4,320,400 | 3/1982 | Chasek | 342/378 |
| 4,360,927 | 11/1982 | Bowen et al. | 455/17 |
| 4,363,134 | 12/1982 | Murata et al. | 455/161 |
| 4,409,687 | 10/1983 | Berti et al. | 455/7 |
| 4,491,978 | 1/1985 | Nagata et al. | 455/338 |
| 4,493,112 | 1/1985 | Bruene | 455/123 |
| 4,523,184 | 6/1985 | Abel | 340/539 |
| 4,531,232 | 7/1985 | Sakurai | 455/152 |
| 4,541,119 | 9/1985 | Cooper et al. | 455/57 |
| 4,584,709 | 4/1986 | Kneisel et al. | 343/702 |
| 4,608,559 | 8/1986 | Friedman et al. | 340/825.5 |
| 4,608,712 | 8/1986 | Fedde | 455/166 |
| 4,617,831 | 10/1986 | Ohashi et al. | 74/10.33 |
| 4,625,212 | 11/1986 | Oda et al. | 343/702 |
| 4,628,152 | 12/1986 | Akerberg | 379/51 |

(List continued on next page.)

FOREIGN PATENT DOCUMENTS

| | | |
|---|---|---|
| 8500482 | 1/1985 | WIPO . |
| 9408361 | 4/1994 | WIPO . |
| 9419873 | 9/1994 | WIPO . |

Primary Examiner—Donald T. Hajer
Assistant Examiner—Tan Ho
Attorney, Agent, or Firm—Vinson & Elkins L.L.P.

[57] ABSTRACT

An automatic antenna tuner which conjugately matches the impedance of an electrically small antenna to the impedance of a transmit amplifier output stage by using a pi-type impedance matching network with adjustable capacitive circuit components which are preferably implemented using a low cost escapement mechanism. During an initial set up tuning procedure, a resistive Wheatstone bridge detector is disposed between the output of the power amplifier and the input to the pi network, to feedback a measure a degree of match of the pi network to a controller. The capacitive elements in the legs of the pi network are then electromechanically adjusted under the operator of the controller until an optimum setting is found. These initial impedance values are determined for each frequency in an operating range and then stored in a non-volatile memory. As a second step in the tuning procedure, a fine adjustment is made to the stored optimum impedance values just prior to transmission, to accommodate changing environmental conditions and the like.

9 Claims, 3 Drawing Sheets

U.S. PATENT DOCUMENTS

| | | | |
|---|---|---|---|
| 4,644,351 | 2/1987 | Zabarsky et al. | 340/825.44 |
| 4,644,561 | 2/1987 | Paneth et al. | 375/9 |
| 4,665,401 | 5/1987 | Garrard et al. | 342/75 |
| 4,682,367 | 7/1987 | Childress et al. | 455/17 |
| 4,712,112 | 12/1987 | Carr | 342/788 |
| 4,740,792 | 4/1988 | Sagey et al. | 342/457 |
| 4,792,988 | 12/1988 | Ohashi et al. | 455/162 |
| 4,804,967 | 2/1989 | Ohe et al. | 343/712 |
| 4,819,001 | 4/1989 | Ohe et al. | 345/712 |
| 4,823,142 | 4/1989 | Ohe et al. | 343/713 |
| 4,849,750 | 7/1989 | Andros et al. | 340/825.44 |
| 4,851,830 | 7/1989 | Andros et al. | 340/825.44 |
| 4,853,688 | 8/1989 | Andros et al. | 340/825.44 |
| 4,856,083 | 8/1989 | Makino | 455/166 |
| 4,857,915 | 8/1989 | Andros et al. | 340/825.44 |
| 4,873,532 | 10/1989 | Sakurai et al. | 343/713 |
| 4,879,570 | 11/1989 | Takizawa et al. | 343/713 |
| 4,891,637 | 1/1990 | Siwiak et al. | 340/825.44 |
| 4,894,856 | 1/1990 | Nakanishi et al. | 379/61 |
| 4,897,835 | 1/1990 | Gaskill et al. | 370/94.1 |
| 4,935,732 | 6/1990 | Andros et al. | 340/825.44 |
| 4,965,607 | 10/1990 | Wilkins et al. | 343/861 |
| 5,032,845 | 7/1991 | Velasco | 342/457 |
| 5,046,130 | 9/1991 | Hall et al. | 455/78 |
| 5,052,049 | 9/1991 | Andros et al. | 455/186 |
| 5,054,120 | 10/1991 | Ushiyama et al. | 455/351 |
| 5,055,851 | 10/1991 | Sheffer | 342/457 |
| 5,063,560 | 11/1991 | Yerbury et al. | 370/18 |
| 5,073,976 | 12/1991 | Kennedy | 455/161 |
| 5,077,834 | 12/1991 | Andros et al. | 455/193 |
| 5,122,795 | 6/1992 | Cubley et al. | 340/825.44 |
| 5,136,719 | 8/1992 | Gaskill et al. | 455/193.1 |
| 5,142,281 | 8/1992 | Park | 340/991 |
| 5,146,227 | 9/1992 | Papadopoulos | 342/20 |
| 5,151,708 | 9/1992 | Nakase et al. | 343/858 |
| 5,153,582 | 10/1992 | Davis | 340/825.44 |
| 5,155,688 | 10/1992 | Tanaka et al. | 364/454 |
| 5,166,694 | 11/1992 | Russell et al. | 342/457 |
| 5,198,825 | 3/1993 | Sakurai et al. | 343/850 |
| 5,206,643 | 4/1993 | Eckelt | 340/932.2 |
| 5,212,492 | 5/1993 | Tesman et al. | 343/860 |
| 5,216,392 | 6/1993 | Fraser et al. | 333/17.3 |
| 5,225,847 | 7/1993 | Roberts et al. | 343/745 |
| 5,227,804 | 7/1993 | Oda | 343/702 |
| 5,248,985 | 9/1993 | Hammerle | 342/457 |
| 5,254,986 | 10/1993 | DeLuca | 340/825.44 |
| 5,258,728 | 11/1993 | Taniyoshi et al. | 333/32 |
| 5,266,945 | 11/1993 | Peek et al. | 340/825.44 |
| 5,280,640 | 1/1994 | Bae | 455/182.3 |
| 5,301,358 | 4/1994 | Gaskill et al. | 455/56.1 |
| 5,444,564 | 8/1995 | Newberg | 333/32 |
| 5,483,680 | 1/1996 | Talbot | 333/17.3 |
| 5,493,311 | 2/1996 | Itoh et al. | 343/860 |

AUTOMATIC ANTENNA TUNER FOR LOW-COST MOBILE RADIO

FIELD OF THE INVENTION

This invention relates generally to antennas and in particular to a low cost automatic antenna tuner for high frequency (HF) mobile radio applications.

BACKGROUND OF THE INVENTION

For transmitting antennas having a narrow tuned bandwidth, it is imperative to achieve an optimum performance level such that maximum radio frequency energy is radiated. This is especially true for applications in mobile radio, where the radio transmitters are typically power limited. One way to maximize the effective radiated power is to ensure that the impedance of the antenna is conjugately matched to the ounce of a transmit amplifier output stage by using a so-called pi-type impedance matching network having shunt capacitive circuit elements and one or more series inductive circuit elements.

Where the transmitter always operates on a fixed carrier frequency, or even over a narrow range of carrier frequencies, the proper antenna tuning can be performed in advance, by selecting the appropriate inductive and capacitive circuit elements to match the antenna impedance.

However, this process becomes more involved when the transmit frequency is not known in advance. In such applications, certain techniques have been developed to automatically tune the antenna to the desired transmit frequency.

One approach is to use a phase discriminator that compares the phase of a current or voltage at the driving point with the phase of a current or voltage in the main conductor of the antenna. The impedance value of an adjustable circuit element is then changed, depending upon the sign of the phase difference.

Other automatic antenna tuning systems attempt to minimize a standing wave ratio at the antenna by sensing a transmitted power and a reflected power. The ratio of these two power levels is then used to indicate a degree of match. Such a system is described in U.S. Pat. No. 5,225,847 issued to Roberts, D. A. and DeWitt, B. T. and assigned to Antenna Research Associates, Inc.

Unfortunately, even such automatic antenna tuning systems have their disadvantages. For example, in certain applications the antenna element or elements are electrically small compared to the operating wavelength of the system. In one such application, namely for mobile radio transmission in the high frequency (HF) radio band, at operating frequencies as low as 3 MegaHertz (MHz), the radio wave length is 100 meters or 328 feet. Obviously, if the radio is to be used in automobiles or as a portable device, practical antennas are necessarily small.

Furthermore, in vehicular applications in particular, the antenna may be regularly exposed to varying environmental conditions such as earth constants, and the elements such as mud, snow, ice, salt, corrosion, and the like, which from time to time may change the impedance which must be matched.

Thus, it has heretofore been thought that mobile radio transmitters must make use of expensive phase or standing ratio adjustment techniques to enable automatic tuning.

DESCRIPTION OF THE INVENTION

Summary of the Invention

Briefly, the invention is an automatic antenna tuner which conjugately matches the impedance of an electrically small antenna to the impedance of a transmit amplifier output stage by using a so-called pi-type impedance matching network having shunt capacitive circuit elements and one or more series inductive circuit elements.

A low cost resistive Wheatstone bridge detector is disposed between the output of the power amplifier and the input to the pi network. An output signal from the bridge is provided to a controller, such as a microprocessor, to feed back a measure of the degree of match of the pi network to the antenna impedance.

Preferably the capacitive elements in the legs of the pi network are electromechanically adjustable, by making use of an escapement mechanism operated under control of a pull-type solenoid. The escapement mechanism uses the linear motion provided by the solenoid against a spring to advance a ratchet arm against the teeth of a ratchet wheel which is attached to a rotary-type adjustable capacitor, to convert the linear motion to the rotary motion of the adjustable capacitor.

The controller then uses the output signal from the bridge detector to adjust the capacitance of one or more of the capacitive elements to maximize the degree of match to the antenna impedance.

As a result, an inexpensive mechanism is provided to match the impedance of the antenna, under control of a microprocessor. Indeed, the exact angular position of the capacitive element can be monitored at all times by counting the number of pulses that have been applied by the microprocessor to the solenoid.

Alternatively, a stepper motor may be used to operate the capacitive elements, but at a greater cost.

The inductance of the pi network may also be varied by switching in various inductive circuit elements also under microprocessor control.

Also in accordance with the invention, a two-step tuning procedure is used to determine the inductance values which includes both a set-up procedure.

The set-up procedure determines an initial starting position for each adjustable circuit element. This set-up procedure is typically performed during an installation procedure, at service time, or during re-initialization procedures. It is an exhaustive search whereby the response of every possible combination of impedance values is examined at each of the frequencies across a radio frequency band of interest. The optimum impedance values are then stored in a non-volatile random access memory (NVRAM) under control of the microprocessor.

The second, pre-transmit tuning procedure is performed just prior to attempting an actual transmission with the antenna. This process serves to fine-adjust the impedance values determined during the set-up procedure, to account for ambient environmental conditions which may be present as a result of deploying the antenna in a vehicle. This pre-transmit tuning procedure performs a shortened version of the initial set-up tuning procedure, where impedance values are examined for frequencies in the immediate vicinity of the values that were stored in the nonvolatile memory during the set-up procedure.

In the event that the pre-transmit tuning process fails to achieve a pre-established tuning quality level, the transmission may still be allowed to occur at a lower power level setting by switching in an attenuator disposed between the transmitter amplifier and tuning device.

The invention has several advantages.

A radio frequency transmitter amplifier designed to operate into a fixed impedance no longer exhibits an unpredictable or widely varying impedance presented by an electrically short antenna, such as one mounted on a vehicle or in a portable radio unit.

An exact impedance matching function is provided between the antenna and transmitter output, which maximizes the effective radiated power.

In applications such as mobile or portable radio devices this not only conserves battery energy, but also permits operation in crowded radio frequency bands such as the high frequency radio band, where the existence of many other transmitters in adjacent frequency channels requires precise tuning.

The automatic antenna tuning system is much less expensive to implement than prior systems which make use of phase or standing power measurement techniques, which are impractical in low cost applications.

BRIEF DESCRIPTION OF THE DRAWINGS

The above and further advantages of the invention may be better understood by referring to the following description in conjunction with the accompanying drawings in which.

DETAILED DESCRIPTION OF A PREFERRED EMBODIMENT

Figure 1:
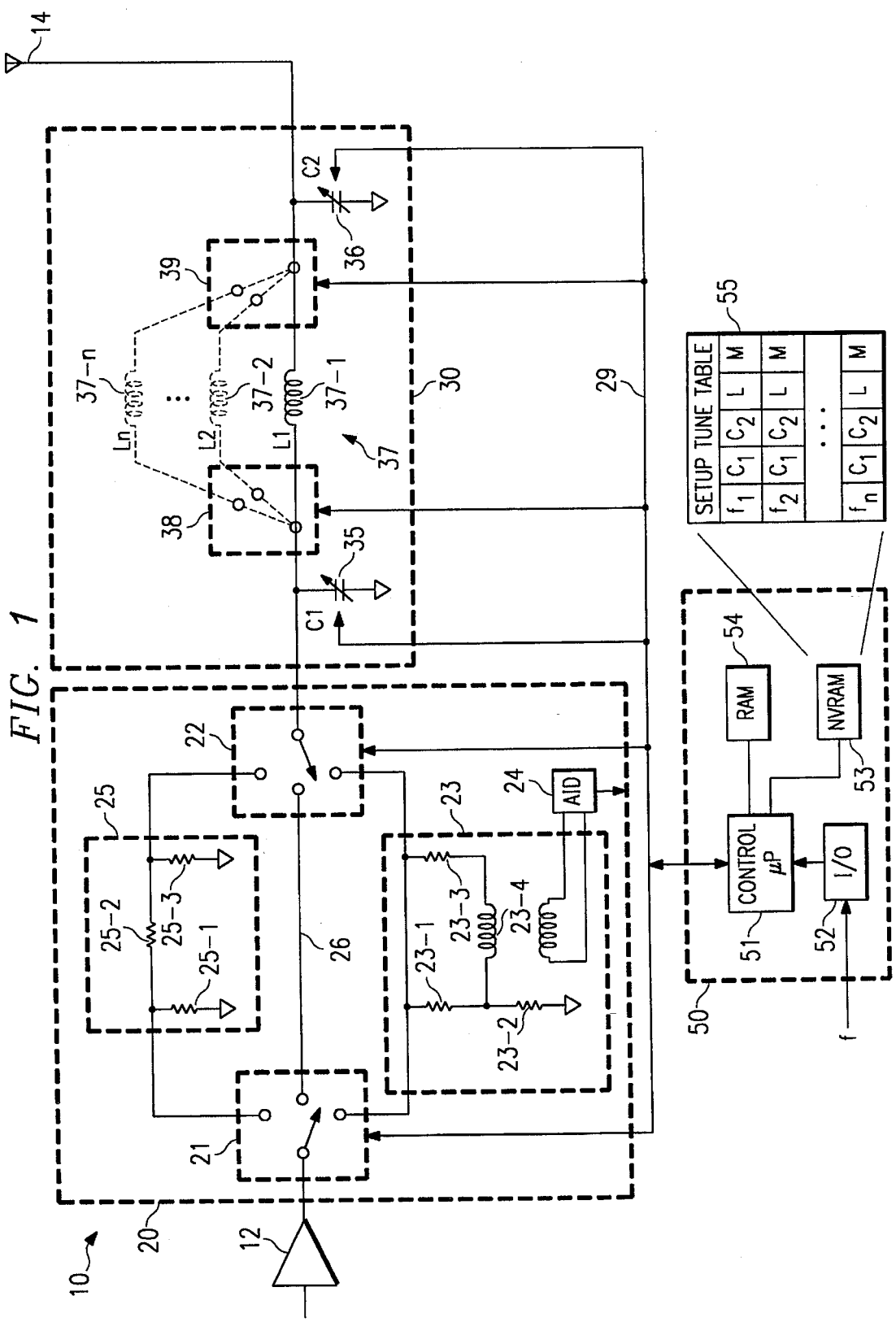
FIG. 1 is a circuit diagram of an automatic antenna tuner according to the invention.

FIG. 1 illustrates an automatic antenna tuner 10 according to the invention, which includes an input selector circuit 20, a pi-type impedance matching network 30 consisting of a pair of adjustable shunt capacitances 35 and 36 and series inductance 37, and a controller 50.

The tuner 10 finds application in a specific type of radio communication system in which mobile and/or portable field units transmit in the high frequency (HF) radio band. In such an application, a signal, f, is received by the controller 50 to tune to a particular frequency. The signal f may be received from network operation control center via a control channel over a radio link operating at HF or in other radio bands. The remote unit is then expected to tune to the commanded frequency and to begin transmission within several seconds.

To accomplish this, the antenna tuner 10 preferably makes use of a pulsed escapement mechanism to implement the adjustable capacitances 35 and 36. In a manner that is described in detail below, the escapement mechanism provides for automatic adjustment of the capacitances 35 and 36 via the controller 50.

The series inductance 37 also be adjustable, if implemented as a number of physical inductors 37-1, 37-2, . . . ,37-n which can be selectively switched into the pi network 30 by switches 38 and 39. The switches 38 and 39 may be ganged together.

More particularly, the tuner 10 conjugately matches impedance the output impedance of a transmitter power amplifier 12 so that a maximum possible amount of power is transmitted to an antenna 14, despite the fact that the antenna 14 is electrically small. This is done by adjusting the impedances in the pi network, such as by operating the adjustable shunt capacitive elements 35 and 36, and/or switching in various values for the series inductance 37.

It should be noted that the controller 50 adjusts these impedances 35, 36, and/or 37 by communicating with the adjustable capacitances 35 and 36, and the switches 38 and 39 over any suitable control interface such as a control bus 29.

The input selector circuit 20, operating in conjunction with the controller 50, determines exactly how much to adjust the impedances 35, 36, and/or 37 in the pi network 30. The input selector circuit 20 consists of a pair of switches 21 and 22, a Wheatstone bridge detector 23, an analog-to-digital (A/D) converter 24 and attenuator 25. The switches 21 and 22 are three position switches which are preferably ganged together and which may be operated under control of the controller 50. In a first position, the switches connect the Wheatstone bridge 23 between the amplifier 12 and pi network 30. This position is used when taking measurements of the degree of match between the pi network 30 and the antenna 14.

A second position of the switches 21 and 22 selects a short path 26 which directly connects the amplifier 12 to the pi network 30. This setting is used during radio frequency operation of the antenna 14.

A third position of the switches 21 and 22 is used to select an attenuator 25 when a predefined degree of match cannot be obtained.

The process of detecting the degree of match and thus the control over the setting of the switches 21, 22, 38 and 39, as well as adjustable capacitances 35 and 36, will become evident in the following discussion of the operation of the controller 50 in connection with FIGS. 3 and 4.

The Wheatstone bridge 23 is preferably a resistive divider type network consisting of a pair of series divider resistors 23-1, 23-2. A resistor 23-3 and coil 23-4 are connected in parallel with the first divider resistor 23-1. The coil 23-4 provides a voltage for detecting a degree of match between the amplifier 12 and pi network 30. The analog-to-digital converter 24 permits the controller 50 to sense the voltage at the coil 23-4.

The attenuator 25 may be any suitable attenuator such as the resistive pi network shown, in which consists of three resistors 25-1, 25-2, and 25-3.

Figure 2:
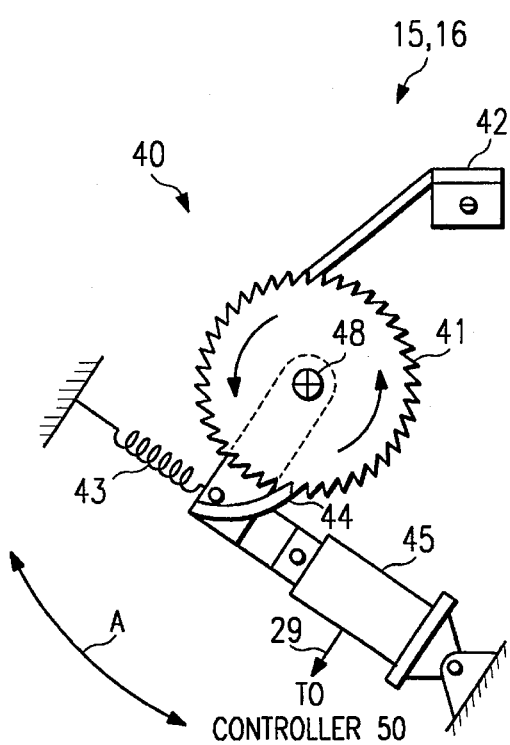
FIG. 2 is a mechanical schematic diagram of an escapement mechanism which is preferably used to implement the adjustable capacitive circuit elements.

FIG. 2 shows a detailed schematic view of an escapement mechanism 40 which is preferably used to implement the adjustable capacitances 35 and 36. The escapement mechanism consists of a central shaft 48 rotating about a pivot point, a ratchet wheel 41, a ratchet pawl 42 which may be spring-loaded, an anchoring spring 43, a ratchet arm 44, and a pull-type solenoid 45 which has a control connection back to the controller 40 via bus 29.

The ratchet wheel 41 may be formed from any suitable, low cost material such as molded plastic. The ratchet pawl 42 may be of a spring metal material such a beryllium copper, formed by stamping. The ratchet arm 44 may be similarly formed. The coil spring 43 is any convenient spring. The solenoid 45 may be any type of pull solenoid.

The spring loaded ratchet pawl 42 provides a bias against outer diameter of the ratchet wheel 41 so that the ratchet wheel 41 will rotate when the ratchet arm is momentarily lifted from contact with the ratchet wheel 41. The central shaft 48 is in mechanical communication with the central shaft of a rotary-type adjustable capacitive circuit element (not shown).

Under command of the controller 50, the solenoid 45 may be operated to move the ratchet arm 44 in either of the directions indicated by the arrow A. As a result, the ratchet wheel 41 is moved in a counterclockwise direction when the ratchet arm 44 is pulled, and movement of the ratchet wheel is halted when the ratchet arm is moved in the other direction. In this manner, any one of the many possible rotary positions of the ratchet wheel 41 may be selected by the controller 50.

Alternatively, the adjustable capacitances 35 and 36 may be implemented using stepper motors in place of the escapement mechanism, albeit at increased cost.

Regardless of the implementation of the adjustable capacitances 35 and 36, because of their mechanical nature, it may take some time for the tuner 10 to reach a steady state after being commanded to tune from a frequency at one end of the high frequency band to a desired tuning position in another place in the high frequency band. Thus, in an effort to reduce the response time for the feedback loop created by the controller 50 in conjunction with the resistive bridge detector 23 and the adjustable capacitances 35 and 36 and/or switchable inductances 37, the invention makes use of a two stage tuning procedure.

Returning briefly to FIG. 1, the controller 50 is implemented using any suitable programmable processors such as a microprocessor 51, an input/output interface 52, and memory in the form of non-volatile random access memory (NVRAM) 53 and random access memory (RAM) 54.

The controller 50 reads data from the A/D converter 24 to determine a database 55 of optimum capacitance and inductance values for each of a number of desired frequencies to be tuned. These stored values are then used as an initial starting position for a second stage, pre-transmit tune process.

This two stage process permits the tuner 10 to quickly switch the capacitance 35 and 36 and inductance 17 to the approximately correct values just prior to transmission at a designated frequency or at least in the neighborhood of the desired frequency, while still accommodating changes in ambient conditions or slight frequency mismatch.

The initial set-up tune procedure is an exhaustive search where all tuning conditions are examined at each of the frequencies at which the antenna is expected to operate. Since it may take many minutes or even several hours to perform the exhaustive search, the set-up procedure is typically only performed when the unit is first placed into service, or is requested to perform a re-initialization process, such as after a catastrophe failure.

Figure 3:
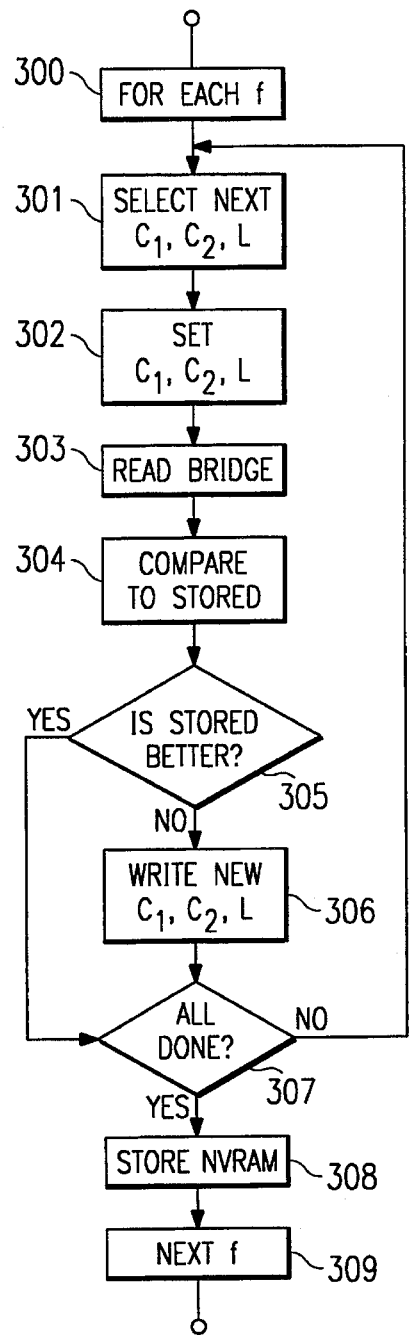
FIG. 3 is a flowchart of a sequence of steps performed by a control microprocessor during an initial set-up tuning procedure.

As shown in FIG. 3, in the first step 300 of this set-up procedure, one of the frequencies to be used is selected.

The next step 301 is to select a value C1 for the capacitance 35, a value C2 for capacitance 36 and a value L for inductance 37.

In step 302 the capacitance values C1 and C2 are set by operating the escapement mechanism 40 associated with each of the capacitors 35 and 36. In addition, the inductance value L may be set by operating the switches 38 and 39 to select one or more of the inductors 37-1, 37-2, . . . ,37-n.

In the next step 303, after a suitable waiting period for the response of the pi network to stabilize, the microprocessor 51 accesses the resistive bridge detector 23 via the A/D converter 24 to obtain a value indicating the match quality for the current setting of the capacitances C1 and C2 and inductance L.

In step 304, this match quality value is then compared to a best stored match quality value for the selected frequency.

In step 305, if the stored match value is not as good as the value most recently read in step 303, then control passes through step 306 where the current C1, C2 and L values are stored as the best values for the current frequency, f.

If, however, in step 305 the stored value is better than the most recently read value, then an update is not made.

In step 307 it is then determined if all variations of impedance values C1, C2 and L have been tried. If this not the case, then control passes back to step 301 where another combination is tried.

If however, each of the capacitance and inductance values have already been already tried, then the set-up tune process is complete for the indicated frequency, and the next frequency in the band may be analyzed.

The stored values in the table 55 may be temporarily stored in a conventional volatile RAM 54 up to this point since a conventional RAM 54 operates more quickly. If the volatile RAM 54 has been used, then a step 308 is performed where the values are written into the non-volatile RAM 53. The use of an NVRAM 53 to store the final values in the set-up tune table 30 permits battery power from the unit 10 to be removed while the unit is not in operation. This permits the rather laborious set-up tune process to occur only once, while the unit is powered up and powered down many times over long periods of time.

Figure 4:
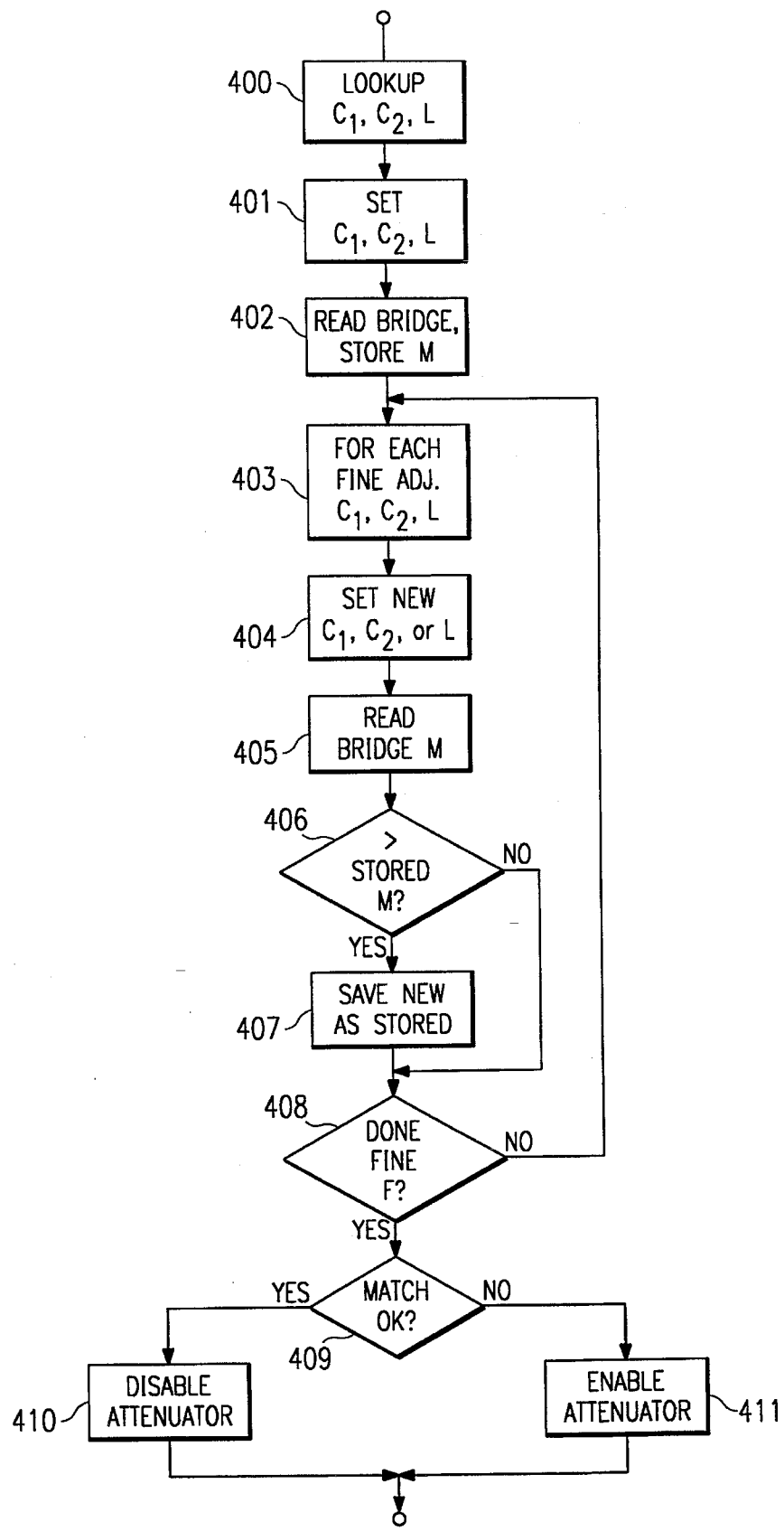
FIG. 4 is a flowchart of the steps performed during a secondary pre-transmit tuning procedure.

FIG. 4 is a sequence of steps performed by the microprocessor 51 during the second stage of the tuning process referred to as a pre-transmit tune procedure. This sequence of steps 400–408 is performed when the microprocessor 51 receives a command to activate the power amplifier 12 and to tune the antenna 14 to a new operating frequency, f. The pre-transmit tune process accounts for variations in ambient antenna conditions such as road dirt, salt, earth constants, snow, ice, rain, water and so forth. Such varying environmental conditions are quite typical when the antenna is installed in a vehicle and can adversely affect the operation efficiency of the antenna.

In a first step 400 the set-up table 55 is consulted to determine initial C1, C2 and L values for the chosen operating frequency, f.

In the next step 401 these values are used by the microprocessor 51 to set the capacitance of capacitors 35 and 36 and inductance 37 accordingly. The actual adjustment is performed by the microprocessor 51 sending an appropriate instruction over the bus 29 to operate the escapement mechanism 39 in each of the capacitances 35 and 36 by the appropriate number of pulls on the solenoid to set the desired capacitance, and to operate the switches 38 and 39 to select the proper inductance.

After a suitable waiting time for the response to settle, step 402 is executed where the match value is read from the bridge detector 23. This match value is then stored as a present best match value.

The next sequence of steps 403–408 is the actual fine tuning procedure.

In step 403 the sequence begins by making a predetermined number of attempts to fine-adjust to the capacitances C1 and C2 and inductance L.

In the first step, a new impedance value set is selected and the response of the bridge 23 is then read via the A/D converter 24 in step 405.

In step 406, if the most recently read match value is better than the match value that was previously stored, then the newly read value is saved as the stored value. If however, this is not the case, then control passes directly to step 408.

In step 408, the sequence is then repeated for the next fine adjustment value of the impedances. At some point, the process terminates, at which time the stored values are then selected as the operating values, and the capacitors 35 and 36 are set.

The control microprocessor 51 may make use of a conventional random access memory (RAM) 54 to store the temporary values which are only used when the unit is in operation, and which are discarded each time that the unit is commanded to tune to a different frequency.

In a final step in the process, in the event that the pre-transmit tune procedure of FIG. 4 fails to achieve a pre-established tune quality in step 409, then the unit is instructed to operate at a low power level by activating a signal path to the antenna 14 through attenuator 25, by switching the switches 21 and 22 to the appropriate position.

What has been described is a low cost automatic antenna tuner that can accommodate the impedance presented by a electrically short vehicle mounted antenna such as a whip or loop antenna without the need for a banks phase shifters, standing wave ratio measurements, or expensive directional couplers.

The invention automatically accommodates changes in environmental conditions, such as can often be presented to a vehicle-mounted antenna, by a two step tuning process.

The invention also uses a nonvolatile RAM to avoid the need to perform a laborious tuning match procedure each time the unit is activated, which conserves battery power.

What is claimed is:

1. An antenna tuner for automatically matching the impedance of an electrically short antenna to the impedance of an output stage of a transmitter amplifier, the antenna tuner operating over a range of frequencies, the automatic antenna tuner comprising:

an impedance matching network consisting of a pair of shunt capacitive circuit elements and at least one inductive circuit element, the capacitance of at least one of the capacitive circuit elements being mechanically adjustable in increments over a range of incremental capacitance values, a first capacitive circuit element of said pair of shunt capacitive circuit elements being disposed between a first node and a ground reference node, a second capacitive circuit element of said pair of shunt capacitive circuit elements being disposed between a second node and the ground reference node, and a series inductive circuit element being disposed between the first and second nodes, the second node for connecting to the antenna;

a resistive bridge network, disposed between the output stage of the transmitter amplifier and the first node, the resistive bridge network providing a bridge output signal indicating a degree of match between an impedance presented by the output stage of the amplifier and the impedance matching network to the impedance presented by the antenna;

means for electromechanically adjusting the capacitance of at least one of the first or second capacitive elements, by reading a capacitance set signal indicating a capacitance value and by then adjusting the capacitance of said at least one adjustable capacitive circuit element to a selectable capacitance value in the range of incremental capacitance values;

non-volatile storage means, for storing a plurality of optimum capacitance values, with at least one optimum capacitance value being associated with one frequency in the range of frequencies to which the antenna can be tuned; and control means, for performing an antenna set-up procedure whereby a set of optimum capacitance values is determined for each frequency in the range of frequencies, the set of optimum capacitance values being then stored in the non-volatile storage means, the optimum capacitance value for each frequency being determined by serially selecting each one of the incremental capacitance values in the range of capacitance values, setting said at least one adjustable capacitve circuit element to that incremental capacitance value by operating the means for mechanically adjusting the capacitance, and then reading the output signal from the resistive bridge network, to determine which incremental capacitance value provides a best impedance match to the antenna, and upon receiving an instruction to tune the antenna to a particular frequency in the range of frequencies, reading the optimum capacitance value for the particular frequency, and for providing the capacitance set signal to the means for electromechanically adjusting.

2. An automatic antenna tuner as in claim 1 wherein the at least one adjustable capacitive circuit element is a rotary-shaft-type adjustable capacitor and the means for electromechanically adjusting the capacitance of said at least one capacitive circuit element additionally comprises:

an escapement mechanism consisting of a central shaft rotating about a pivot point which is coupled to a rotary shaft of said at least one capacitive circuit element, a ratchet wheel connect to the central shaft, the ratcher wheel engaging a ratchet pawl, a ratchet arm disposed adjacent the ratchet wheel to incrementally rotate the ratchet wheel upon application of a force in a linear direction thereto; and a solenoid, for receiving the capacitance set signal and for applying linear force to the ratchet arm in response thereto to perform one or more incremental rotations of the ratchet wheel to thereby set the capacitance of the adjustable capacitive circuit element.

3. An antenna tuner as in claim 2 wherein a spring is disposed opposite the solenoid and ratcher arm to provide a rotary biasing force against the ratchet wheel.

4. An antenna tuner as in claim 1 wherein the at least one adjustable capacitive circuit element is a rotary-shaft-type adjustable capacitor and the means for electromechanically adjusting the capacitance of the at least one capacitive circuit element additionally comprises:

a stepper motor arranged to receive the capacitance set signal, and to rotate a rotary shaft of the at least one capacitive circuit element in response thereto, thereby setting the capacitance.

5. An antenna tuner as in claim 1 wherein each of the first and second adjustable capacitive circuit elements is mechanically adjustable over a range of impedance values, additionally comprising:

means for electromechanically adjusting a second one of the capacitive circuit elements in response to a second capacitance set signal indicating a second capacitance value, and then adjusting the capacitance of the second capacitive circuit element to a second selectable capacitance value in the range of incremental capacitance values.

6. An antenna tuner as in claim 5 wherein the non-volatile storage means additionally stores a plurality of optimum capacitance values for the second adjustable capacitive circuit element, and wherein the control means additionally determines an optimum second capacitance value for each frequency in the range of frequencies.

7. An antenna tuner as in claim 1 wherein the inductive circuit element comprises a plurality of inductors and associated switches, and wherein the non-volatile storage means stores a plurality of optimum impedance values for the inductive circuit element, and wherein the control means additionally determines an optimum inductance value for each frequency in the range of frequencies.

8. An antenna tuner as in claim 1 wherein the control means additionally performs a pre-transmit procedure upon receiving the instruction to tune the antenna to the particular frequency by reading the stored optimum capacitance value and then selecting a subset of the incremental capacitance values near the stored optimum capacitance value, and then serially setting the at least one adjustable capacitve circuit element to each of the incremental subset capacitance values by operating the means for mechanically adjusting the capacitance, and then reading the output signal from the resistive bridge network, to determine which of the incremental capacitance values in the subset provides a best impedance match to the antenna just prior to operating the antenna.

9. An antenna tuner as in claim 8 additionally comprising:

an attenuator disposed between the outer stage of the transmitter amplifier and the first node;

a switch arranged to operate the attenuator; and wherein the control means additionally determines whether the pre-transmit tuning process fails achieves a pre-established tuning quality level, and if not, then operating the switch to enable the attenuator.

* * * * *